United States Patent
Wicklow et al.

(10) Patent No.: US 6,515,478 B1
(45) Date of Patent: Feb. 4, 2003

(54) METHOD FOR THE CORRECTION OF ARTIFACTS IN MAGNETIC RESONANCE IMAGES

(75) Inventors: Karsten Wicklow, Erlangen (DE); Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 84 days.

(21) Appl. No.: 09/606,065

(22) Filed: Jun. 29, 2000

(30) Foreign Application Priority Data

Jul. 6, 1999 (DE) .......................... 199 31 210

(51) Int. Cl.$^7$ ................................. G01V 3/00
(52) U.S. Cl. ................... 324/313; 324/309; 324/307
(58) Field of Search .................. 324/309, 307, 324/306, 318, 322, 313, 312, 300

(56) References Cited

U.S. PATENT DOCUMENTS

| | | | |
|---|---|---|---|
| 5,689,186 A | * 11/1997 | Maier et al. ............. | 324/309 |
| 5,689,189 A | * 11/1997 | Morich et al. ........... | 324/318 |
| 5,877,629 A | 3/1999 | King et al. ............... | 324/309 |
| 5,923,168 A | 7/1999 | Zhou et al. .............. | 324/309 |
| 6,064,205 A | * 5/2000 | Zhou et al. .............. | 324/309 |

OTHER PUBLICATIONS

Weis et al., article "Magnetic Field stabilizer for NMR imaging systems with resistive magnets". Review of Scientific Instruments 58(12), Dec. 1987 pp. 2256–2259.*

Nonaxial Whole–Body Instant Imaging, Weisskoff et al, *J. Mag. Res. in Med.*, vol. 29 (1993), pp. 796–803.

* cited by examiner

*Primary Examiner*—Edward Lefkowitz
*Assistant Examiner*—Tiffany A. Fetzner
(74) *Attorney, Agent, or Firm*—Schiff Hardin & Waite

(57) ABSTRACT

In a method for correcting artifacts in magnetic resonance images that are caused, in a magnetic resonance device, by transverse magnetic field components that are oriented transverse to a basic magnetic field of the magnetic resonance device, wherein the magnetic resonance device has a gradient coil system for generating magnetic gradient fields and a high frequency transmitter for exciting magnetic resonance signals, during a measurement sequence a frequency correction value is fed to the high frequency transmitter for a correction area, this frequency correction value being determined dependent on the transverse magnetic field components, and/or an additional gradient field is produced for compensating the transverse magnetic field components.

8 Claims, 2 Drawing Sheets

METHOD FOR THE CORRECTION OF ARTIFACTS IN MAGNETIC RESONANCE IMAGES

BACKGROUND OF THE INVENTION

1. Field of the Invention

The present invention is directed to a method for correcting artifacts in magnetic resonance images, the artifacts being of the type caused in a magnetic resonance device by transverse magnetic field components that are oriented transverse to the basic magnetic field, the magnetic resonance device having gradient coils for generating magnetic gradient fields and a high frequency transmitter for exciting magnetic resonance signals.

2. Description of the Prior Art

A method for this purpose is disclosed in the article by Robert M. Weisskoff, Mark S. Cohan, Richard R. Rzedzian with the title "Non-axial Whole-Body Instant Imaging", published in the Journal of Magnetic Resonance in Medicine, Vol. 29, 1993, pp. 796–803, in connection with echo planar imaging (EPI). This article notes that, for imaging a slice that lies apart from a central plane, secondary magnetic gradient fields can cause image distortions and ghosts in these images. The secondary gradientfields are always associated with the imaging gradient fields and can be derived directly from the Maxwell equations. These additional, undesired gradient fields are therefore also known as Maxwell terms. The article notes, for example, that a transverse z-gradient in the x-component of the magnetic field is always associated with an imaging x-gradient. For reducing image distortion caused by the Maxwell terms, it is proposed to add an additional read-gradient between the high frequency-excitation pulse and the 180° refocusing pulse. Thus, prior to the refocusing pulse, the same phase is added to the excited spins, like after the refocusing pulse, by the Maxwell term. In the correction by means of adding gradient pulses into the measurement sequences, it is a disadvantage that this method is only even possible for a few specific sequence types, and that, under circumstances, the performance capability of the measurement sequences is decreased by additional switching times for gradients. On the other hand, other optimizing criteria in the sequence design are precluded by the boundary conditions for the addition of gradient pulses.

The article also mentions that the image distortions caused by the Maxwell terms can be corrected by a $Z^2$-shim coil using a compensation current. This is, however, characterized in the article as being complicated because the compensation current must have a square-shaped curve given sinusoidal gradients. Moreover, the correction is incomplete because the gradient coils produce no $Z^2$ field.

Finally, the article also mentions that the artifacts caused by the Maxwell terms can be corrected in post-processing of the image. The post-processing is similar to the compensation of irregularly shaped, imaging gradients, in which the actual field is taken into account in the correction algorithm. A disadvantage of distortion correction in the post processing is that the signal losses by destructive noise of several echos cannot be compensated.

A method for the correction of image artifacts produced by Maxwell-terms given echo-planar-imaging is disclosed in German OS 198 21 780. Therein, the frequency errors and phase errors caused by the Maxwell-terms are calculated and subsequently compensated during data collection by means of a dynamic adjustment of the receiver frequency and receiver phase.

U.S. Pat. No. 5,877,629 discloses a method for the correction of artifacts in MR-images, whereby previously calculated phase errors are used in order to determine currents for driving coils for the compensation of Maxwell fields of higher orders. Alternatively, the reference frequency in the receiver correspondingly changes during the reception.

SUMMARY OF THE INVENTION

An object of the present invention is to provide a method for correcting artifacts in magnetic resonance images that are generated by transverse magnetic field components, wherein the above-discussed disadvantages of conventional methods can be substantially avoided.

This object is inventively achieved in a method wherein, during a measurement sequence for a correction area, a frequency correction value is fed to the high frequency transmitter, the frequency correction value being determined dependent on the transverse magnetic field components. In general, additional magnetic fields in the magnetic resonance device effect a shifting of the resonant frequency and thus, among other things, a distortion in the imaging. Using the present invention, it is proposed to compensate the shifting of the resonant frequency (that is caused by transverse magnetic field components) with the aid of an appropriate resetting of the excitation frequency. Since the Maxwell term exhibits a location (spatial) dependency, this method requires the specification of a defined spatial reference point, in the proximity of which the correction of artifacts is complete. Correction in an area around this reference point also can still be attained, if the location dependency of the frequency shift is represented as a series development of the transverse field components. In the inventive method, the 0-th order term of this series development, corresponding to a location-independent frequency shift, is compensated by means of an appropriate resetting of the high frequency excitation frequency. The $1^{st}$ order term that corresponds to a spatial, linear, location dependent frequency shift, is compensated by a gradient offset in the corresponding axis or axes. Terms of higher orders can be taken into consideration in principle as well, e.g. by a suitable dynamic drive of the coils. This is not specifically discussed herein, however, because such higher order terms usually do not significantly contribute to the aforementioned artefacts, and therefore correction of such terms is usually not worthwhile.

By means of the inventive method, a spatial translation of the behavior of the Maxwell terms can be achieved. This applies in the axial as well as in the radial directions. The "axial direction" means the direction of the basic magnetic field and "radial direction" means the transverse direction relative thereto. Given magnetic resonance devices of conventional solenoid construction, for example, a translation of the behavior of the Maxwell terms could be used in the axial direction for a nearly artifact free measurement with large slice displacement. A displacement of the behavior of the Maxwell terms in the transverse direction could help avoid artifacts, for example, is an optimized examination of a shoulder.

Application of this method to multi-slice techniques is possible in so far as a slice can be allocated to each gradient pulse, on the signals of this slice being acted on by the gradient pulse.

In an embodiment, the frequency correction value is selected dependent on a symmetry parameter, this symmetry parameter being characteristic for a symmetrical behavior of the transverse magnetic field components. Thus, the behavior of the Maxwell terms given asymmetrical gradient coils can be shifted in space such that it corresponds to that of a symmetrical gradient coil.

DESCRIPTION OF THE PREFERRED EMBODIMENTS

Figure 1:
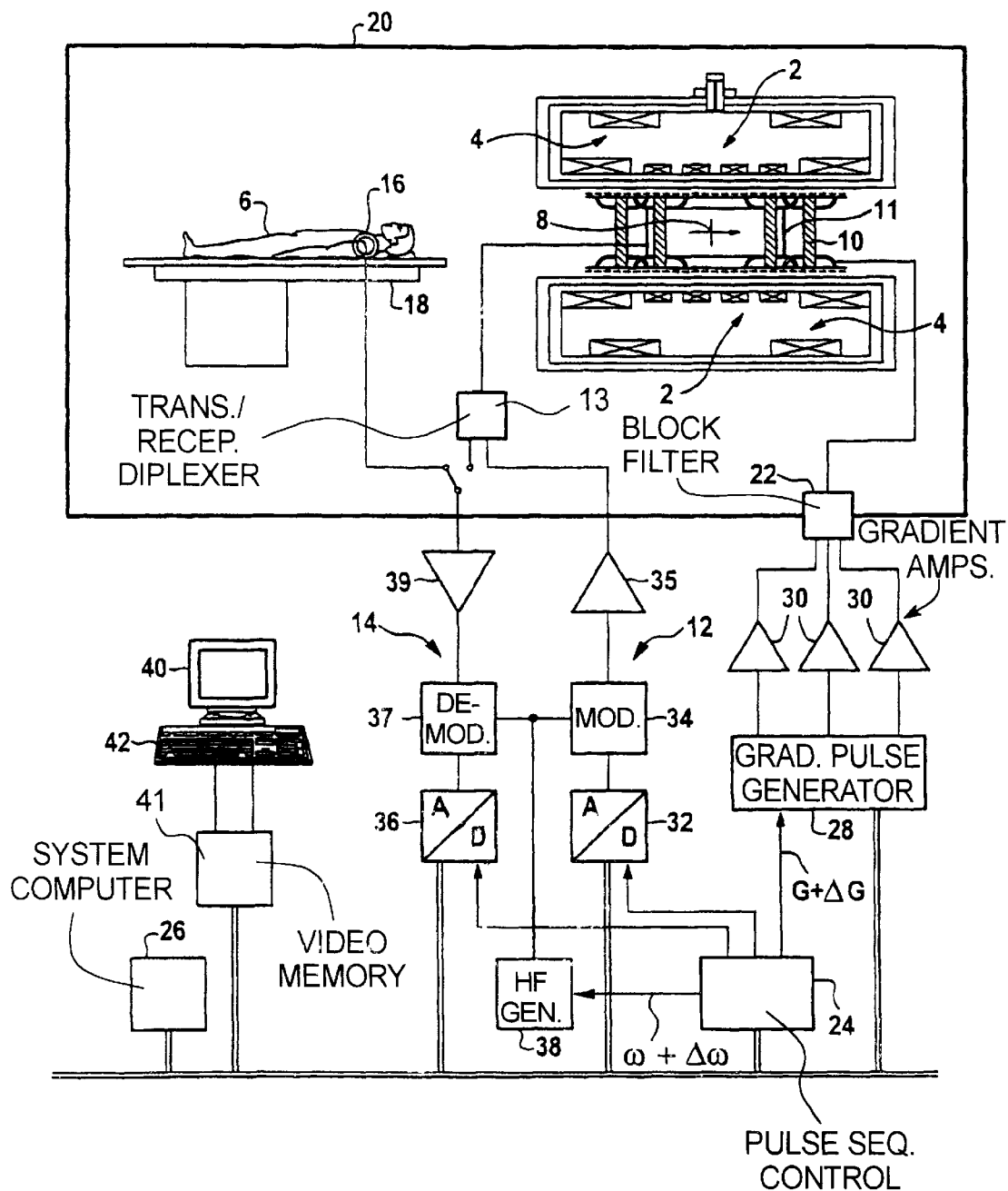
FIG. 1 is a block diagram showing the basic components of a diagnostic magnetic resonance device, wherein artifacts generated by transverse field components are extensively compensated, in accordance with the invention.

Artifacts can occur in measurement sequences in magnetic resonance devices with high gradient amplitude or low magnetic field intensity such artifacts express themselves as, for example:

- phase errors in phase-sensitive methods (e.g. flow measurements),
- image distortions
- inhomogeneities (e.g. shadows) within the images or
- signal loss as a result of de-phasing of the magnetizing over the measurement volumes.

These artifacts are correctable with the method disclosed herein, if they stem from transverse field components, especially transverse field components generated by a gradient coil. The physical association of the transverse field components with the magnetic fields necessary for imaging are discussed in the relevant literature; however, they are presented again herein for understanding assisting in the invention. Peculiarities that result from an asymmetrical construction of a gradient pulse are also considered herein.

In a diagnostic magnetic resonance device, location dependent (spatially dependent) magnetic fields are superimposed on a static basic field $\vec{B}_0$ of a magnet by means of gradient coils, described by a vector $\vec{B}_{grad}(\vec{r})$ with the components $B_x$, $B_y$, $B_z$, whereby a Cartesian coordinate system is assumed. The direction of the basic field $B_0$ defines the Z-axis of the coordinate system. The resonant frequency (relevant for a magnetic resonance measurement) of the nuclei to be excited then arises from the value $\vec{B}(\vec{r})$:

$$|\vec{B}| = \sqrt{(B_0+B_z)^2 + B_x^2}$$

Under the assumption that the basic field $B_0$ is large in magnitude component to the field $\vec{B}_{grad}$ of the gradient coils, the following approximation can be considered:

$$|\vec{B}| \approx B_0 + B_z + \frac{B_x^2 + B_y^2}{2B_0}$$

The gradient coils are generally optimized such that the $B_z$-components exhibit a linear location dependency in the respective coordinate axes x, y, z. Then, e.g. in the linear area of an X-gradient coil:

$$|\vec{B}| \approx B_0 + G_x \cdot x + \frac{B_x^2 + B_y^2}{2B_0},$$

whereby $G_x$ is the gradient intensity and x is the coordinate value in the x-direction.

Typically, only the $B_z$-components of the first terms ($G_x \cdot x$) are considered for the imaging. The second term gains relevance with increasing gradient field intensity or with a small basic field $B_0$ given low-field systems.

This second term is often identified as the "Maxwell term": The association between the optimized field component $B_z$ and the respective transverse field components $B_x$ or and $B_y$ in the second term is a direct consequence from the Maxwell equation for magnetic fields $$\mathrm{curl}\,\vec{B} = 0 \Rightarrow \frac{\partial B_z}{\partial_x} - \frac{\partial B_x}{\partial_z} = 0,$$

and thus cannot be avoided in principle.

Thus, the transverse field component $B_x(z)$ can be calculated, for example, by integration using the Maxwell equation at any point z on the z-axis of an X-gradient coil, assuming a point $z^0$ and $B_x(z^0)$ being known:

$$B_x(z) = B_x(z^0) + \int_{z'=z^0}^{z} \frac{\partial B_x}{\partial z} dz' = B_x(z^0) + \int_{z'=z^0}^{z} \frac{\partial B_z}{\partial x} dz'$$

Within the linearity volume, e.g. of the x-gradient coil, it may be assumed:

$$\frac{\partial B_z}{\partial_x} \equiv G_x \approx \mathrm{const.}$$

Deriving therefrom is the simplification:

$$B_x(z) = B_x(z^0) + G_x(z - z^0)$$

It is expedient to select the point $z^0$ such that it coincides with the origin of the MR-coordinate system (gradient-isocenter). The origin (z=0) is determined here by the Z-gradient.

Thus, the calculation is simplified:

$$B_x(z) = B_x(z=0) + G_x \cdot z$$

Given a gradient coil with a symmetrical construction with regard to the plane z=0, then $B_x(0)=0$ at the origin. Given asymmetrical construction, however, it is possible that $B_x(0) \neq 0$, whereby the transverse field components are then proportional to a current through the relevant gradient coil, i.e. proportional to the gradient amplitude $G_x$. Therefore, it is expedient to indicate this characteristic parameter $\Psi$ of a gradient coil as a relative value, the physical unit of which corresponds to a length.

$$B_x(0) \propto G_x \Rightarrow \Psi \equiv \frac{B_x(0)}{G_x}$$

As a result:

$$B_x(z) = B_x(0) + G_x z = G_x(\Psi + z)$$

Depending on the construction of the coil, it can be, for symmetry reasons, that $B_y(x)=0$. With the assumption of $B_y=0$, the magnetic base field value sought above and relevant for the MR-experiment is:

$$|\vec{B}| \approx B_0 + G_x \cdot x + \frac{G_x^2 \cdot (\Psi + z)^2}{2B_0}$$

$$|\vec{B}| \approx B_0 + G_x \cdot x + \frac{G_x^2}{2B_0} \cdot (\Psi^2 + 2\Psi z + z^2)$$

The last term is used herein as the "Maxwell term". This term acts as a noise term that is proportional to the square of the gradient amplitude and inversely proportional to the base field intensity of the magnet. As a result, artifacts can appear particularly in magnetic resonance tomographs with high gradient amplitudes or low magnetic field intensity in some measurement sequences. The location dependency of the Maxwell term in the z-direction corresponds to a parabola that is shifted by the coordinate origin for asymmetrical gradient coils ($\Psi \neq 0$).

The above derivation of the Maxwell term for the X-gradient coil applies accordingly for a Y-gradient coil.

For a Z-gradient coil, somewhat different calculations apply that are also described in the literature.

Since the Maxwell term exhibits a location dependency, the correction method requires the stipulation of a specific spatial reference point, in the proximity of which the correction is complete.

In a small area $\delta$ around this reference point, the location dependency of the frequency shift is calculated by the transverse field components and shown as a series development. In the inventive correction method:

the 0-th order term of this series development, that produces (or contributes to) the location dependent frequency shift, is compensated by a corresponding resetting of the excitation frequency with a frequency correction value $\Delta\omega$, and/or the $1^{st}$ order term of this development, that produces (or contributed to) the spatially linear location dependent frequency shift is compensated by a gradient offset $\Delta G$ of the corresponding axis or axes.

Further terms of higher order could, in principle, also be considered; a dynamic driving of a corresponding coil (e.g. of the shim system) is, however, not presented herein.

FIG. 1 shows the basic structure and the interaction of the components of a diagnostic magnetic resonance device, with which artifacts in magnetic resonance images that are generated by transverse magnetic field components can be extensively reduced independently of the measurement sequence to be used. A base field magnet 2 that is fashioned as an axial, superconducting air coil magnet with an active stray field screening 4 produces a time invariant and spatially homogenous magnetic filed $B_0$ for polarizing the atomic nuclei in a body 6 to be examined. The basic magnetic field $B_0$ is axially oriented with regard to the magnet and defines the z-coordinate direction of a Cartesian xyz-coordinate system 8. The necessary spatial homogeneity in a measurement volume is produced by shims located in the magnet bore, generally sheets of iron in a specific arrangement, and/or specific electric field coils.

A cylindrical gradient coil system 10 is concentrically disposed in the magnetic bore. The gradient coil system 10 has three gradient coils that produce respective gradient fields proportional to the respectively impressed currents and that are spatially orthogonal respective to each other. The gradient field in the direction of the basic magnetic field is identified as an axial gradient field, whereas the two gradient fields transverse thereto are identified as transverse gradient fields. The gradient coils generating the gradient fields are identified accordingly. Within the gradient coil system 10, there is a high frequency antenna 11. It has the task of converting high frequency pulses emitted by a high frequency transmission channel 12 into a magnetic alternating field for exciting the atomic nuclei and subsequently converting an alternating field emanating from the precessing nuclear moment into a voltage conveyed to a reception channel 14. Switching between these channels is accomplished by a transmission/reception diplexer 13. Specific, regionally sensitive antennas, referred to as local antennas, are alternatively used for the signal reception depending on the region of the body to be examined.

A patient gurney 18 supplements the above recited device components.

Since the reception antennas 11 or 16 must be shielded as extensively as possible against high frequency noise, they are located with the magnets 2, the coils 10 of the gurney 18 within a closed, metallic booth 20. Lines in the booth are conveyed through a blocking filter 22.

A pulse sequence control 24 controls the measurement cycle independent of a system computer 26 with appropriate (known) control programs. The pulse sequence control 24 controls the emission of a gradient pulse from generator 28 that is linked at the output side to gradient amplifiers 30 for the respective gradient axes. In addition, envelope amplitudes for high frequency transmission pulses are fed to a modulator 34 from the pulse sequence control 24 via a digital/analog converter 32. At the output side, the modulator 34 is linked to a high frequency amplifier 35. The pulse sequence control 24 also controls an analog/digital converter 36 in the reception channel 14. Finally, the carrier frequency, that corresponds to the frequency for the excitation of the nuclei (for imaging nearly exclusively protons) and to the magnetic resonance signals radiated by the nuclei, is supplied to a high frequency generator 38 by the pulse sequence control 24. The high frequency generator 38 supplies the modulation frequency and the demodulation frequency for the modulator 34 in the transmission channel 12 and for a demodulator 37 that follows an input amplifier 39 in the reception channel 14.

Magnetic resonance images stored in a video (image) memory 41 can be displayed via a monitor 40 including an operating console 42 with which the magnetic resonance device can be operated using an appropriate operator interface.

Artifacts in magnetic resonance images of off center regions, i.e. slices, that lie at a distance from the isocenter of the magnetic resonance device and that stem from transverse field components, are considerably avoided in accordance with the invention by a frequency correction value $\Delta\omega$ and/or an additional gradient field $\Delta G$. The frequency correction value $\Delta\omega$ is determined in the pulse sequence control 24 and is added to a frequency value $\omega$; additional gradient fields $\Delta G$ are additionally generated by the pulse sequence control 24 for the compensation of the transverse field components. The amplitude and the time curve of the additional gradient fields $\Delta G$ are added to the conventionally formed theoretical values for the gradient fields.

As is already apparent from the preceding discussion of the physical background, the frequency correction value $\Delta\omega$ as well as individual or all additional gradient fields $\Delta G$ can be zero depending on the compensation location.

Figure 2:
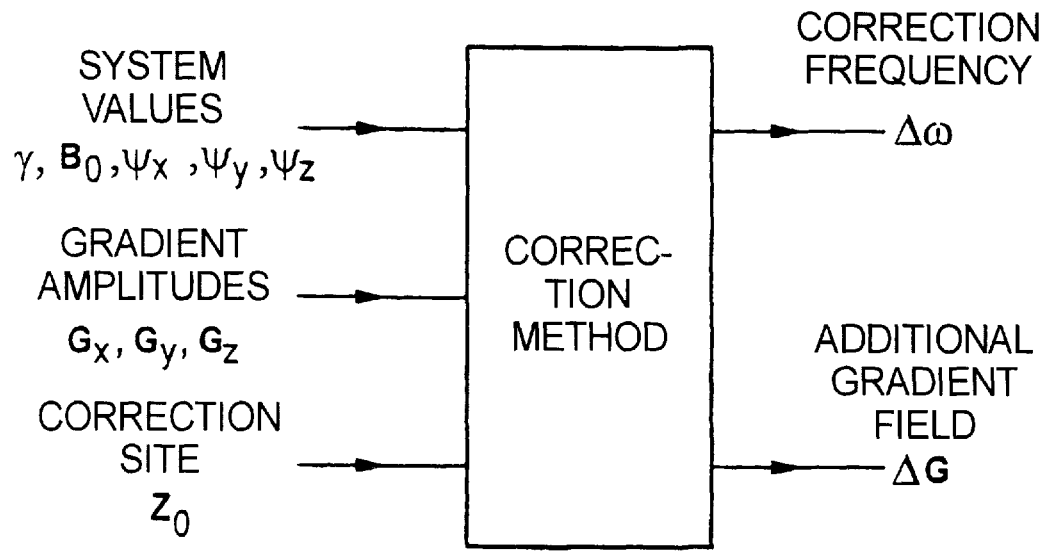
FIG. 2 shows the input and output values of the inventive correction method.

FIG. 2 shows the input and output values of the correction methods in an overview. As input values, the inventive method uses the magnitude $B_0$ of the basic field and the characteristic parameters $\Psi X$, $\Psi Y$ and $\Psi Z$ applicable as a result of the construction of the gradient coils for the various orientations GX, GY and GZ for the symmetrical behavior of the transverse components of each gradient coil. Dependent on the measurement parameters, or sequence parameters, the gradient amplitudes G are still used as inputs in the method at each time point of the sequence and at each correction location where the compensation is to be operative. From these input values, a correction 0-th order term is determined, for the corresponding correction location, that is provided as the correction frequency $\Delta\omega$ for the dynamic resetting of the high frequency generator. If, for example, the Maxwell term to be compensated is caused by an asymmetrical x-gradient coil, the Maxwell term can be considered as the correction frequency $\Delta\omega$ for the high frequency generator 38 in a small area around a correction location $z_0$.

The correction frequency $\Delta\omega$ is derived from the x-gradient amplitude $G_x$ as:

$$\Delta\omega = \frac{\gamma}{2B_0}(\Psi_x + z_0)(\Psi_x - z_0)G_x^2,$$

wherein $\gamma$ signifies the gyromagnetic constant of the corresponding nucleus.

Given the use of asymmetrical x- and y-gradient coils, the result is the correction frequency $\Delta\omega$ according to:

$$\Delta\omega = \frac{\gamma}{2B_0} \cdot ((\Psi_x + z_0)(\Psi_x - z_0) \cdot G_x^2 + (\Psi_x + z_0)(\Psi_x - z_0) \cdot G_y^2)$$

If symmetrical gradient coils are used, the system parameters $\Psi X$ and $\Psi Y$ are zero.

The correction $1^{st}$ order term is compensated with an additional gradient field $\Delta G$. Given an asymmetrical x-gradient coil, an additional gradient field $\Delta G_z$ is added to the z-gradient field, that is determined as follows:

$$\Delta G_z = \frac{-1}{B_0} \cdot (\Psi + z_0) \cdot G_x^2$$

In the case of asymmetrical x- and y-gradient coils, the result is a correction value for the gradient amplitude $G_z$ of:

$$\Delta G_z = \frac{-1}{B_0} \cdot (\Psi_x + z_0) \cdot G_x^2 + (\Psi_y + z_0) \cdot G_y^2.$$

Here, the system parameters $\Psi_x$ and $\Psi_y$ are also zero given symmetrical gradient coils.

For measurements of several slices (multi-slice sequences), a different value for $z_0$ can be used for each slice. Then, for the calculation of the correction values, position parameters of the slice must be allocated to each gradient pulse of the sequence, the Maxwell terms acting on the spins in the slice that is relevant for the gradient pulse.

Figure 3:
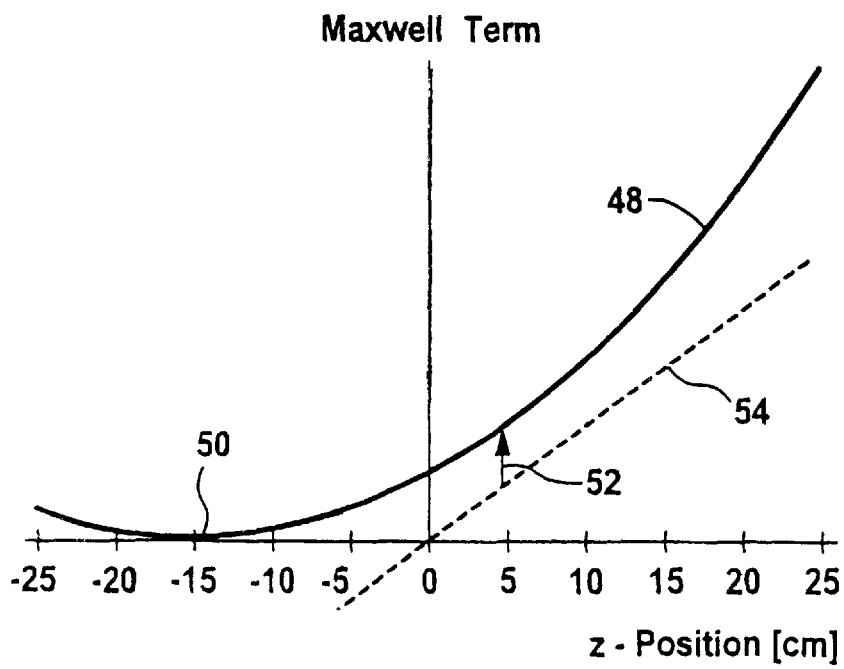
FIG. 3 is a diagram illustrating the Maxwell term for a transverse gradient field dependent on location in the axial direction.

FIG. 3 illustrates the correction effect as a result of the frequency correction value $\Delta\omega$ and the additional gradient field $\Delta G$. It shows a qualitative curve 48 of the Maxwell term of an asymmetrically constructed x-gradient coil dependent on location in the direction of the z-coordinate. The asymmetrically constructed x-gradient coil has a Maxwell isocenter 50 given a z-position of −15 cm. The origin of the coordinate system is defined by the zero crossing of the $B_z$-components produced by the z-gradient coil (gradient isocenter). The curve of the field distortion caused by the Maxwell term corresponds approximately to a parabola. If image distortions that stem from the transverse field components are to be reduced in an area around the position $z_0$=5 cm, the frequency shift (in the magnetic resonance signal) caused by the Maxwell terms is taken into consideration by an additional gradient field $\Delta G$ in the z-direction that corresponds to a curve 52 and by a frequency correction value $\Delta\omega$ that corresponds to a curve 54. As a result, image distortions which otherwise would be caused are already corrected extensively in the signal generation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for correcting artifacts in magnetic resonance images, said artifacts being caused in a magnetic resonance device by system-related transverse magnetic field components that are oriented transverse to a basic magnetic field of the magnetic resonance device, said magnetic resonance device having a gradient coil system for generating magnetic gradient fields and a high frequency transmitter which emit radiated signals, having a frequency, for exciting magnetic resonance signals, comprising the steps of:

determining a frequency correction $\Delta\omega$ dependent on the system-related transverse magnetic filed components;

during a measurement sequence for a correction area, emitting transmitter-radiated signals, having a frequency from said high-frequency transmitter and thereby exciting nuclear magnetic resonance signals;

supplying said frequency correction value $\Delta\omega$ to the high frequency transmitter which alters the frequency of said transmitter-radiated signals by said correction value $\Delta\omega$ independent of said nuclear magnetic resonance signals.

2. A method as claimed in claim 1, comprising forming the frequency correction value $\Delta\omega$ dependent on the square of at least one of said transverse gradient field components.

3. A method as claimed in claim 1 wherein said gradient coil system includes an asymmetrical gradient coil, and comprising forming the frequency correction value $\Delta\omega$ dependent on a symmetry parameter characterizing a position of a Maxwell isocenter of a transverse magnetic field component from said asymmetrical gradient coil.

4. A method as claimed in claim 1 comprising forming the frequency correction value $\Delta\omega$ according to:

$$\Delta\omega = \frac{\gamma}{2B_0}(\Psi + z_0)(\Psi - z_0)G^2,$$

wherein $\gamma$ is the gyromagnetic constant for a nucleus producing said magnetic resonance signals, $B_0$ is the basic magnetic field, $\Psi$ is a symmetry parameter representing any gradient field asymmetry produced by a gradient coil of said gradient coil system, $z_0$ identifies a position of a slice being excited, with regard to a zero point of a z-gradient field produced by said gradient coil system, and $G$ is a magnetic field gradient produced by a transverse gradient coil.

5. A method as claimed in claim 1 comprising producing an additional gradient field $\Delta G$ for compensating the transverse magnetic field components.

6. A method as claimed in claim 5, comprising forming the additional gradient field $\Delta G$ dependent on the square of a transverse gradient field.

7. A method as claimed in claim 6 wherein said gradient coil system includes an asymmetrical gradient coil, and comprising forming the frequency correction value $\Delta G$ dependent on a symmetry parameter characterizing a position of a Maxwell isocenter of a transverse magnetic field component from said asymmetrical gradient coil.

8. A method as claimed in claim 7, comprising forming the additional gradient field $\Delta G$ according to:

$$\Delta G = \frac{-1}{B_0}(\Psi + z_0)G^2,$$

wherein:

$B_0$ is the basic magnetic field, $\Psi$ is a symmetry parameter representing any gradient field asymmetry produced by a gradient coil of said gradient coil system, $z_0$ is a position of an excited slice with regard to a zero point of a z-gradient field produced by said gradient coil system, and $G$ is a magnetic field gradient produced by a transverse gradient coil.

* * * * *